(12) United States Patent
Alivisatos et al.

(10) Patent No.: US 10,177,271 B2
(45) Date of Patent: Jan. 8, 2019

(54) PHOTODETECTORS EXPLOITING ELECTROSTATIC TRAPPING AND PERCOLATION TRANSPORT

(71) Applicants: A. Paul Alivisatos, Berkeley, CA (US); Miquel Salmeron, Kensington, CA (US); Yingjie Zhang, Urbana, IL (US); Daniel J. Hellebusch, Oakland, CA (US)

(72) Inventors: A. Paul Alivisatos, Berkeley, CA (US); Miquel Salmeron, Kensington, CA (US); Yingjie Zhang, Urbana, IL (US); Daniel J. Hellebusch, Oakland, CA (US)

(73) Assignee: the Regents of the University of California, Oakland, CA (US)

( * ) Notice: Subject to any disclaimer, the term of this patent is extended or adjusted under 35 U.S.C. 154(b) by 4 days.

(21) Appl. No.: 15/359,882

(22) Filed: Nov. 23, 2016

(65) Prior Publication Data
US 2017/0148938 A1    May 25, 2017

Related U.S. Application Data

(60) Provisional application No. 62/259,760, filed on Nov. 25, 2015.

(51) Int. Cl.
| | |
|---|---|
| H01L 31/09 | (2006.01) |
| H01L 31/18 | (2006.01) |
| H01L 31/0296 | (2006.01) |
| H01L 31/0368 | (2006.01) |
| H01L 31/113 | (2006.01) |

(52) U.S. Cl.
CPC .... *H01L 31/1872* (2013.01); *H01L 31/02963* (2013.01); *H01L 31/0368* (2013.01); *H01L 31/09* (2013.01); *H01L 31/1136* (2013.01); *H01L 31/1836* (2013.01); *H01L 31/1892* (2013.01); *Y02E 10/50* (2013.01)

(58) Field of Classification Search
CPC ................................................ H01L 31/02963
See application file for complete search history.

(56) References Cited

U.S. PATENT DOCUMENTS

| | | | |
|---|---|---|---|
| 4,231,808 A | 11/1980 | Kawaziri et al. | |
| 5,994,642 A | 11/1999 | Higuchi et al. | |
| 6,281,035 B1 | 8/2001 | Gessert | |

(Continued)

OTHER PUBLICATIONS

Konstantatos, G. et al. Nanostructured materials for photon detection. Nat. Nanotechnol. 5, 391-400 (2010).

(Continued)

*Primary Examiner* — Alexander Ghyka

(57) ABSTRACT

This disclosure provides systems, methods, and apparatus related to photodetectors. In one aspect, a photodetector device comprises a substrate, a polycrystalline layer disposed on the substrate, and a first electrode and a second electrode disposed on the polycrystalline layer. The polycrystalline layer comprises nanograins with grain boundaries between the nanograins. The nanograins comprise a semiconductor material. A doping element comprising a halogen is segregated at the grain boundaries. A length of the polycrystalline layer is between and separating the first electrode and the second electrode.

20 Claims, 16 Drawing Sheets

(56) References Cited

U.S. PATENT DOCUMENTS 6,458,254 B2    10/2002    Gessert
9,147,793 B2    9/2015    Gessert et al.

OTHER PUBLICATIONS

Konstantatos, G. et al. Hybrid graphene-quantum dot phototransistors with ultrahigh gain. Nat. Nanotechnol. 7, 363-368 (2012).

Visoly-Fisher, I. et al. Direct evidence for grain-boundary depletion in polycrystalline CdTe from nanoscale-resolved measurements. Appl. Phys. Lett. 82, 556-558 (2003).

Visoly-Fisher, I., et al. How polycrystalline devices can outperform single-crystal ones: Thin film CdTe/CdS solar cells. Adv. Mater. 16, 879-883 (2004).

Owen, J. S. et al. Reaction chemistry and ligand exchange at cadmium-selenide nanocrystal surfaces. J. Am. Chem. Soc. 130, 12279-12281 (2008).

Anderson, N. C. et al. Soluble, chloride-terminated CdSe nanocrystals: ligand exchange monitored by 1H and 31P NMR spectroscopy. Chem. Mater. 25, 69-76 (2013).

Norman, Z. M. et al. J. S. Electrical transport and grain growth in solution-cast, chloride-terminated cadmium selenide nanocrystal thin films. ACS Nano 8, 7513-7521 (2014).

Khosroabadi, S. et al. Design of a high efficiency ultrathin CdS/CdTe solar cell using back surface field and backside distributed Bragg reflector. Opt. Express 22, A921-A929 (2014).

Ahrenkiel, R. K. et al. Spatial uniformity of minority-carrier lifetime in polycrystalline CdTe solar cells. Appl. Phys. Lett. 64, 2879-2881 (1994).

Long, Q. et al. Electron and hole drift mobility measurements on thin film CdTe solar cells. Appl. Phys. Lett. 105, 042106 (2014).

Deen, M. J. et al. Low-frequency noise in cadmium-selenide thin-film transistors. Appl. Phys. Lett. 77, 2234-2236 (2000).

Li, C. et al. Grain-boundary-enhanced carrier collection in CdTe solar cells. Phys. Rev. Lett. 112, 156103 (2014).

Jeon, S. et al. Gated three-terminal device architecture to eliminate persistent photoconductivity in oxide semiconductor photosensor arrays. Nat. Mater. 11, 301-305 (2012).

Verger, L. et al. New developments in CdTe and CdZnTe detectors for X and γ-ray applications. J. Electron. Mater. 26, 738-744 (1997).

Panthani, M. G. et al. High efficiency solution processed sintered CdTe nanocrystal solar cells: The role of interfaces. Nano Lett. 14, 670-675 (2014).

Zhang, Y. et al. Ultrasensitive photodetectors exploiting electrostatic trapping and percolation transport. Nature Communications 7 (2016).

PHOTODETECTORS EXPLOITING ELECTROSTATIC TRAPPING AND PERCOLATION TRANSPORT

RELATED APPLICATIONS

This application claims priority to U.S. Provisional Patent Application Ser. No. 62/259,760, filed Nov. 25, 2015, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

BACKGROUND

Photodetectors, devices that convert photons to electricity, are widely used in digital imaging, optical communications, remote sensing, night-time surveillance, medical imaging, and so on. Their sensitivity, the ability to differentiate signal from noise, is key for high-fidelity photon detection and imaging, especially when the signal is weak. To achieve high sensitivity, a high gain is needed to amplify the signal far above the noise baseline.

One way to achieve high gain is to multiply the photo-generated charge carriers in a single carrier transport and collection cycle, as done in photomultiplier and avalanche photodiode devices, which achieve typical gains of $10^3$-$10^8$ carriers per incident photon. However, for photomultiplier and avalanche photodiode devices, the required high bias (hundreds to thousands of volts) and their bulky nature restrict their integration with micro-electronics for digital imaging. In addition, the electron multiplication processes give rise to excess noise.

Another approach towards high gain is to collect each photocarrier multiple times over many transport cycles in simple, two-terminal devices with semiconductor channels. These devices, known as photoconductive material-based devices (a subset of photodetectors), are designed to trap the minority charge carriers for a long time, enabling majority carriers to recirculate through the device many times before recombining. In this way, multiple carrier collection occurs with the absorption of one photon. Small and simple in design, photoconductive material-based devices are compatible with modern micro-electronics, and can be integrated as, for example, pixel sensors in the widely used CMOS (complementary metal-oxide-semiconductor) technologies.

The performance of a photoconductive material-based device depends on the deliberate control of minority carrier trapping, with the goal of achieving long carrier lifetime while preserving the high-mobility, low-noise majority carrier transport. Typically, minority carriers are retained in sub-bandgap states or electrostatic barriers induced by defects, dopants, electronic junctions, or a combination of these factors. However, these minority carrier traps are often in the pathway of majority carrier transport, leading to carrier scattering, reduced mobility, and noise, which limit the photon sensitivity.

SUMMARY

A strategy to engineer a heterogeneous system with high photo-sensitivity by sequestering the majority and minority carriers in different local domains using grain boundary delta doping (GBDD) is described herein. It is known that chloride doping at grain boundaries (GBs) in CdTe polycrystalline layers establishes local p-n junctions that localize electrons in the GB regions, and direct holes towards the grain interiors (GIs). The GB doping, density, and connectivity can be engineered by exploiting the versatile surface chemistry of colloidal nanocrystals.

For example, as described herein, a photoactive layer was fabricated via kinetically controlled sintering of Cl-capped CdTe nanocrystals. The spatial separation between photo-generated electrons and holes and the defect passivation in the GBs enables low-noise electron transport and high photoconductive gain simultaneously. It was further demonstrated that electrostatic quenching enabled a device reset in about 100 microseconds, much faster than previously reported high-gain photoconductive material-based devices.

One innovative aspect of the subject matter described in this disclosure can be implemented in a photodetector device including a substrate, a polycrystalline layer disposed on the substrate, and a first electrode and a second electrode disposed on the polycrystalline layer. The polycrystalline layer comprises nanograins with grain boundaries between the nanograins. The nanograins comprise a semiconductor material. A doping element comprising a halogen is segregated at the grain boundaries. A length of the polycrystalline layer is between and separating the first electrode and the second electrode.

Another innovative aspect of the subject matter described in this disclosure can be implemented in a method including fabricating a plurality nanocrystals. The plurality of nanocrystals comprise a semiconductor material. Each nanocrystal of the plurality of nanocrystals has ligands disposed on a surface of the nanocrystal. At least some of the ligands on each nanocrystal of the plurality of nanocrystals are exchanged with a doping element comprising a halogen. The plurality of nanocrystals is then deposited on a substrate. The plurality of nanocrystals is annealed to form a polycrystalline layer comprising nanograins. A first electrode and a second electrode are deposited on the polycrystalline layer. A length of the polycrystalline layer is between and separating the first electrode and the second electrode.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
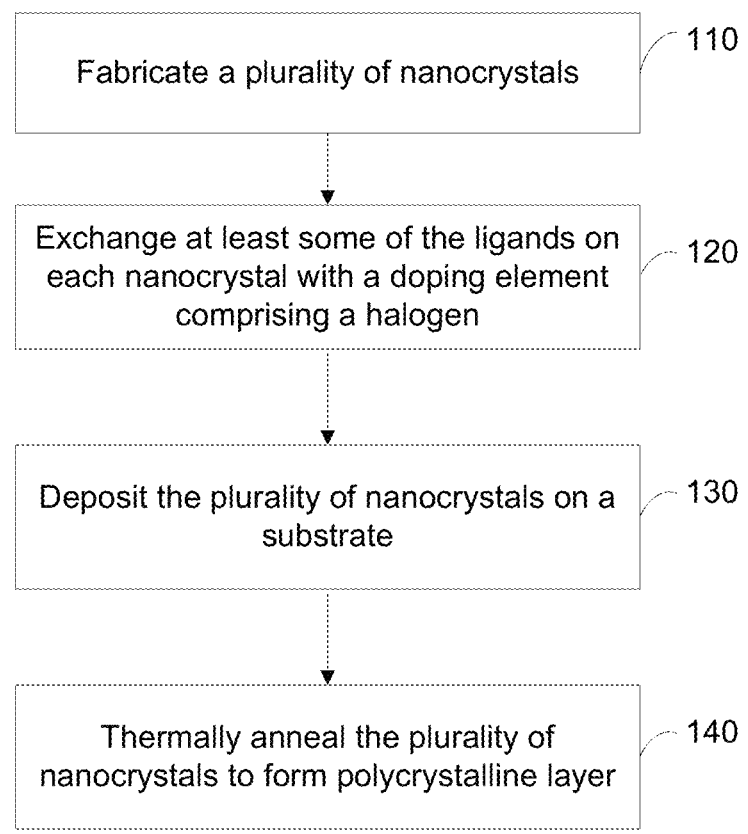
FIG. 1 shows an example of a flow diagram illustrating a manufacturing process for a polycrystalline layer.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

In the last decade, there have been significant advances in the surface modification of colloidal nanocrystals. A new concept of grain boundary delta doping (GBDD) to take advantage of the rich surface chemistry of nanocrystals for bottom-up fabrication of mesoscale materials is proposed herein. As an example of the proposed methods, CdTe nanocrystals surface modified with the eventual dopant atoms, in this case Cl, were fabricated. Arrays of nanocrystals were annealed so that they sintered into polycrystalline layers, during which process Cl selectively segregated to the grain boundaries (GBs), doping these regions n-type. The engineered GBDD established built-in electric fields making the grain interiors (GIs) fully charge depleted. These fields guide hole trapping in GIs and facilitate electron percolation along the GBs.

The spatial heterogeneity in doping, electrostatic potential, and electronic transport—critical to the designed photodetector—were characterized by local microscopy and spectroscopy techniques. Nano-Auger electron spectroscopy confirmed that Cl was concentrated in the GBs of the sintered polycrystalline layer. Local potential variations were resolved by Kelvin probe force microscopy (KPFM), and revealed that the Fermi level of GBs and GIs are about −4.4 eV to −4.5 eV and −4.8 eV to −4.9 eV (relative to vacuum level), respectively. Since the conduction band minimum (CBM) and valence band maximum (VBM) are at approximately −4.3 eV and −5.8 eV, respectively (relative to vacuum level), it was concluded that the GBs are heavily n-doped while the GIs are weakly n-doped or nearly intrinsic. Spatial current mapping using conductive atomic force microscopy (CAFM) revealed a higher conductivity in GBs compared with GIs, as expected from the higher carrier concentration and trap-passivation in the GBs.

Properties of the polycrystalline layer contrast with those of the traditional top-down deposited CdTe polycrystalline layers, which have micron scale grains significantly larger than those in the layers described herein (e.g., about 50 nm to 200 nm). The potential in large grains is mostly flat with small band bending only near the GBs (about 100 mV), due to the less effective Cl doping in GBs and the small depletion region width (about 200 nm). Although used for efficient solar cells, these layers are not applicable for high-gain photoconductive material-based devices since photocarriers in the flat band and low-barrier GB regions are subject to rapid recombination. This is due to a lack of driving field for carrier separation in the GIs and the overlap of the transport pathways of electrons and holes (holes can tunnel through GBs), which yield short carrier lifetimes (nanoseconds to microseconds).

A bottom-up fabricated device as described herein has several advantages compared with previous high-gain detectors, including: long carrier lifetime up to about 10 seconds, due to the long spatial separation between electrons and holes (tens of nm) and the large electrostatic potential barriers (hundreds of mV) between them; low-noise electron transport with high mobility, achieved by GBDD and trap-passivation in the GBs; tunable response time since the hole trapping electrostatic barrier can be overcome by pulsed injection of electrons leading to rapid recombination; and low-cost solution-processable and scalable fabrication process, where the thickness of the layer can be tuned by changing the concentration of the nanocrystal solutions and/or by repeating the spin-coating and annealing procedures multiple times.

Figure 2A:
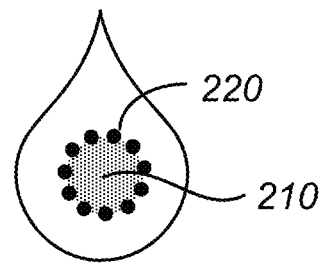
FIGS. 2A-2C show examples of schematic illustrations of a polycrystalline layer at various stages in the manufacturing process.
Figure 2B:
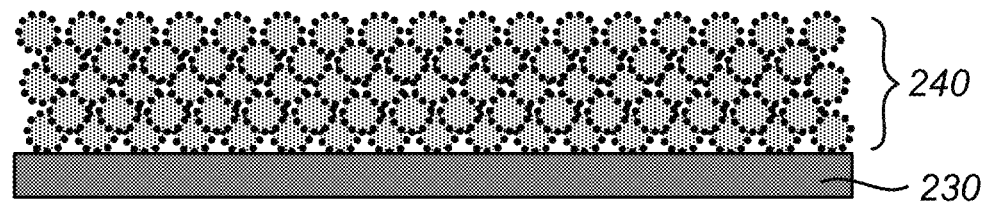
Figure 2C:
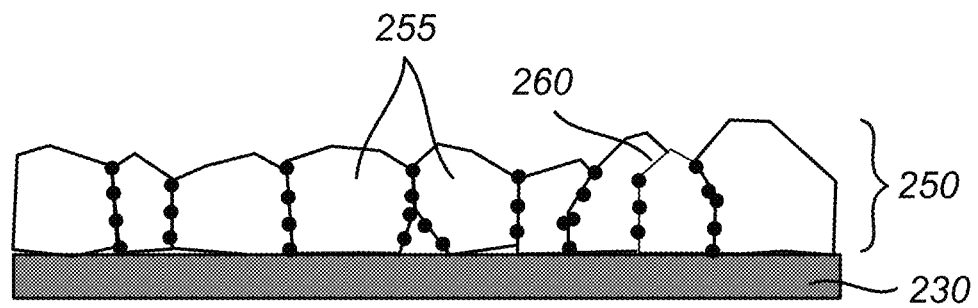

FIG. 1 shows an example of a flow diagram illustrating a manufacturing process for a polycrystalline layer. FIGS. 2A-2C show examples of schematic illustrations of a polycrystalline layer at various stages in the manufacturing process.

Starting at block 110, a plurality a nanocrystals is fabricated. The nanocrystals can be fabricated using a number of different methods. For example, appropriate molecular precursors, surfactants, and solvents may be used to fabricate the plurality of nanocrystals. In some embodiments, the plurality of nanocrystals comprises a semiconductor material. In some embodiments, the plurality of nanocrystals comprises a III-V semiconductor material or a II-VI semiconductor material. Group II-VI semiconductor materials can be considered to include IIA-VI semiconductor materials and IIB-VI semiconductor materials, including cadmium selenide (CdSe), cadmium telluride (CdTe), zinc oxide (ZnO), zinc selenide (ZnSe), zinc sulfide (ZnS), and zinc telluride (ZnTe).

In some embodiments, the plurality of nanocrystals comprises a III-V ternary alloy semiconductor material, such as aluminum gallium arsenide, aluminum gallium indium phosphide, aluminum gallium nitride, aluminum gallium phosphide, aluminum indium arsenide, gallium arsenide phosphide, gallium indium arsenide antimonide phosphide, indium arsenide antimonide phosphide, indium gallium arsenide, indium gallium nitride, and indium gallium phosphide, for example. In some embodiments, the plurality of nanocrystals comprises a II-VI ternary alloy semiconductor material, such as cadmium zinc telluride (CdZnTe, CZT), mercury cadmium telluride (HgCdTe), and mercury zinc telluride (HgZnTe), for example.

In some embodiments, the plurality of nanocrystals comprises a II-III-IV$_2$ semiconductor material. Group II-III-IV$_2$ material can be considered to include a combination of elements in group IIB, III, and IV with atomic ratios 1:1:2, including copper-indium-gallium-selenide (CIGS), copper-zinc-tin-sulfide (CZTS), alloys thereof, and combinations thereof. In some embodiments, the plurality of nanocrystals comprises a perovskite semiconductor material. Perovskite semiconducting materials have a perovskite crystal structure and an appropriate band gap for photon absorption. An example of a perovskite semiconducting material is methylammonium lead trihalide, where the halide can be Cl, Br, and I.

In some embodiments, each nanocrystal of the plurality of nanocrystals has ligands disposed or deposited on a surface of the nanocrystal. In some embodiments, dimensions of a nanocrystal of the plurality of nanocrystals are about 2 nanometers (nm) to 8 nm, or about 5 nm. For example, if a nanocrystal is spherical, the nanocrystal has diameter of about 2 nm to 8 nm, or about 5 nm. In some embodiments, the nanocrystals have a shape that is a spherical shape, a flake-like shape, a dendritic shape, an elongated shape, a fibrous shape, and combinations thereof.

In some embodiments, after the plurality of nanocrystals is fabricated, the plurality of nanocrystals is purified. For example, the plurality of nanocrystals after block 110 may be suspended in a liquid. In some embodiments, some of the nanocrystals suspended in the liquid can be separated from the liquid using a centrifuge. The nanocrystals can be redispersed in another liquid and separated from the liquid using the centrifuge to remove residual chemical species from the nanocrystals.

At block 120, at least some of the ligands on each nanocrystal of the plurality of nanocrystals are exchanged with a doping element comprising a halogen. Halogens include fluorine, chlorine, bromine, and iodine. In some embodiments, the doping element comprises chlorine. In some embodiments, the doping element consists of chlorine. In some embodiments, the doping element comprises a mixture of halogens.

FIG. 2A shows an example of an illustration a nanocrystal of the plurality of nanocrystals after block 120. As shown in FIG. 2A, doping element 220 is disposed on a surface of a nanocrystal 210.

For example, the following process was used to fabricate the Cl-capped CdTe (chloride-capped cadmium telluride) nanocrystals used in the photodetector devices described in FIGS. 6C, 6D, 7C-7F, 8, and 9A-9C. CdTe nanocrystals capped with cadmium oleate (Cd(Oleate)$_2$) were fabricated by combining CdO, oleic acid, and octadecene in a flask. The mixture was degassed under vacuum at 100° C. for an hour. Meanwhile, two solutions of Te in tributylphosphine (TBP) were prepared by mixing Te and TBP in a vial and heating to 220° C. until the powder dissolved and the solution became clear and yellow (e.g., in about 90 minutes). Once a clear yellow solution was reached, it was cooled to room temperature. After degassing the contents of the flask, the head space was backfilled with argon and heated to 270° C. to form the cadmium oleate complex indicated by a color change from red to clear and colorless. Once the temperature stabilized at 270° C., the flask was removed from the heating mantle and the Te/TBP solutions were injected into the hot solution. On injection, the clear solution quickly changed to a dark color. The flask was cooled to room temperature. After the solution cooled, the flask was connected to a distillation apparatus and the volatiles were vacuum distilled at 130° C. and 55 mtorr until a little of liquid remained. The crude product in the still pot was transferred to a Schlenk flask and stored in an argon atmosphere.

Nanocrystals were isolated and purified in an argon atmosphere. A small amount of the crude product was added to a centrifuge tube, filled with methyl acetate, and then centrifuged. The clear supernatant was disposed and the formed dark colored pellet with small amount of white content was dispersed in a small amount of pentane. Methyl acetate was added to create a turbid solution which was centrifuged. The supernatant was disposed and the pellet was cleaned with three additional pentane/methyl acetate washing steps. By the last step, the pellet no longer contained a white residue. Finally, the pellet was dispersed in toluene and filtered into a clean glass vial with a PTFE filter. The solution was then dried under vacuum until all volatiles were removed. The dried residue was dispersed in toluene.

The CdTe nanocrystal surface reaction was performed in an argon environment. The residual water was removed from all reagents and solvents using drying methods. TBP was added to the CdTe—Cd(oleate)$_2$ nanocrystals dispersed in toluene in a glass vial. While the solution was stirred, trimethylsilychloride (TMSCl) was added (12 TMSCl molecules per nm$^2$ of nanocrystal surface). After the solution was stirred for 1 hour, the volatiles were removed by vacuum distillation at room temperature. After distilling for 1 hour, toluene was added to the remaining product and the vial was shaken to facilitate uniform mixing and then centrifuged. The clear supernatant was disposed and toluene was added to pellet and stirred. Octylamine (three molecules per nm$^2$ of nanocrystal surface) was added and the nanocrystals immediately dispersed. After stirring for 1 hour, methyl acetate was added to flocculate the solution, which was then centrifuged. The supernatant was then disposed. The toluene/octylamine/methyl acetate step was repeated two more times. The final pellet was dispersed in toluene, filtered with a PFTE filter into a clean glass vial, and then dried under vacuum for 1 hour. The dark residue was dispersed in toluene to a desired nanocrystal concentration.

Returning to FIG. 1, at block 130, the plurality of nanocrystals is deposited on a substrate. In some embodiments, the plurality of nanocrystals is deposited on the substrate using a solution-processing technique. For example, spin coating may be used to deposit the plurality of nanocrystals on the substrate.

FIG. 2B shows an example of the plurality of nanocrystals after block 130. As shown in FIG. 2B, a plurality of nanocrystals is deposited on a substrate 230 to form a nanocrystal layer 240.

Returning to FIG. 1, at block 140, the plurality of nanocrystals is annealed to form a polycrystalline layer. In some embodiments, the substrate on which the plurality of nanocrystals is deposited in placed on a hotplate or placed in a furnace. In some embodiments, the plurality of nanocrystals is annealed at about 150° C. to 800° C., about 300° C. to 400° C., or about 350° C. In some embodiments, the plurality of nanocrystals is annealed for a period of about 1 second to 30 minutes or about 30 seconds to 5 minutes. In some embodiments, the annealing process is performed in an inert environment, such as a nitrogen atmosphere or an argon atmosphere, for example.

During the annealing process, a number of different processes may occur. First, any ligands remaining on surfaces of the plurality of the nanocrystals may desorb. Then, surfaces of individual nanocrystals may begin fusing. After surfaces of individual nanocrystals being fusing or fuse, grain growth may occur. For example, each of the nanocrystals may initially form a grain, but with surfaces of the nanocrystals fusing and grain growth occurring, two or more nanocrystals may form one grain in the polycrystalline layer.

FIG. 2C shows an example of a polycrystalline layer after block 140. As shown in FIG. 2C, a polycrystalline layer 250 is disposed on the substrate 230. The polycrystalline layer 250 comprises nanograins 255. The nanograins 255 are formed from nanocrystals of the plurality of nanocrystals that have fused and/or grown in size due to the annealing process. The doping elements 220 that were disposed on surfaces of the plurality of nanocrystals are positioned in grain boundaries 260 that form between nanograins 255 of the polycrystalline layer 250 due to the annealing process. In some embodiments, the doping elements 220 are positioned in all of the grain boundaries 260 that form between nanograins 225 of the polycrystalline layer 250. In some embodiments, the doping elements 220 are positioned in the grain boundaries 260 that form between nanograins 255 throughout the thickness of the polycrystalline layer 250. In some embodiments, a largest dimension of a nanograin is about 10 nm to 200 nm, about 50 nm to 200 nm, about 50 nm to 100 nm, or about 50 nm to 75 nm. In some embodiments, the polycrystalline layer 250 has a thickness of about 10 nm to 100 nm.

In some embodiments, to form a thicker polycrystalline layer, blocks 130 and 140 are repeated (i.e., layer-by-layer deposition). In some embodiments, blocks 130 and 140 are repeated and the polycrystalline layer has a thickness of about 50 nm to 10 mm, about 10 nm to 5 microns, or about 10 nm to 400 nm. In some embodiments, to form a thicker polycrystalline layer, a solution having a high concentration of nanocrystals is used in the deposition process at block 130. For example, the concentration of nanocrystals in the solution may be about 0.5 mM to 1 mM to form a polycrystalline layer that has a thickness of about 50 nm to 200 nm.

In some embodiments, after the thermal annealing process at block 140, the polycrystalline layer is removed from the substrate. In some embodiments, after the polycrystalline layer is removed from the substrate, it is transferred to a different substrate. For example, the substrate may be a sacrificial substrate. In some embodiments, the polycrystalline layer is mechanically peeled from the substrate and transferred (i.e., dry transferred) to a different substrate. In some embodiments, the polycrystalline layer is removed from the substrate using an etching process and transferred (i.e., wet transferred) to a different substrate. The polycrystalline layer may be removed from the substrate when the thermal annealing process interferes with fabrication of a device including the polycrystalline layer. For example, the thermal annealing process at block 140 may degrade the metal interconnects used in CMOS integrated circuits.

Figure 3:
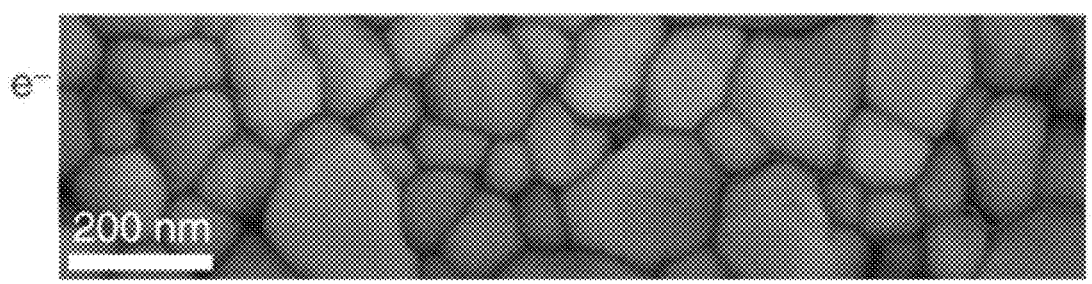
FIG. 3 shows an example of a scanning electron microscopy (SEM) image of a CdTe polycrystalline layer.

FIG. 3 shows an example of a scanning electron microscopy (SEM) image of a CdTe polycrystalline layer with Cl positioned at the grain boundaries. The line and arrow represent a pathway along GBs for electron percolation.

Figure 4A:
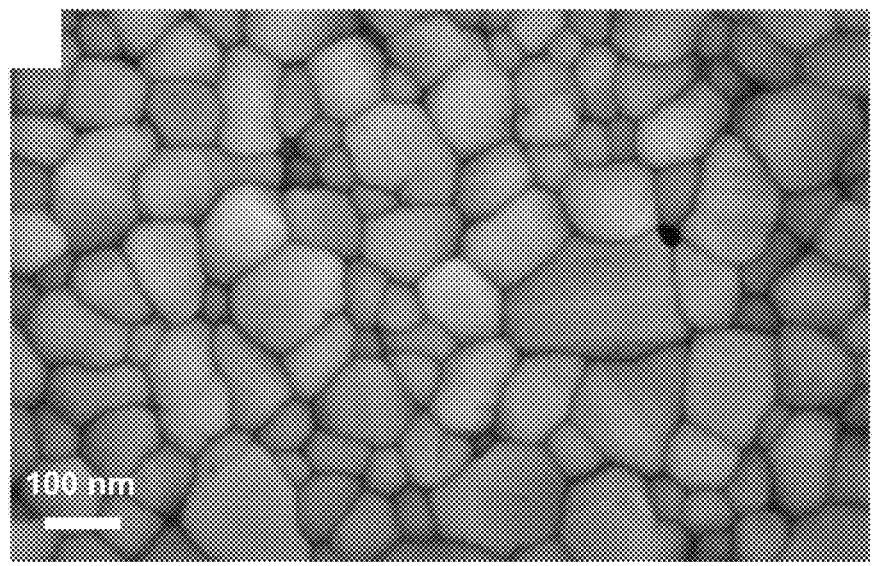
FIGS. 4A and 4B show examples of scanning electron microcopy images of sintered CdTe polycrystalline layers.
Figure 4B:
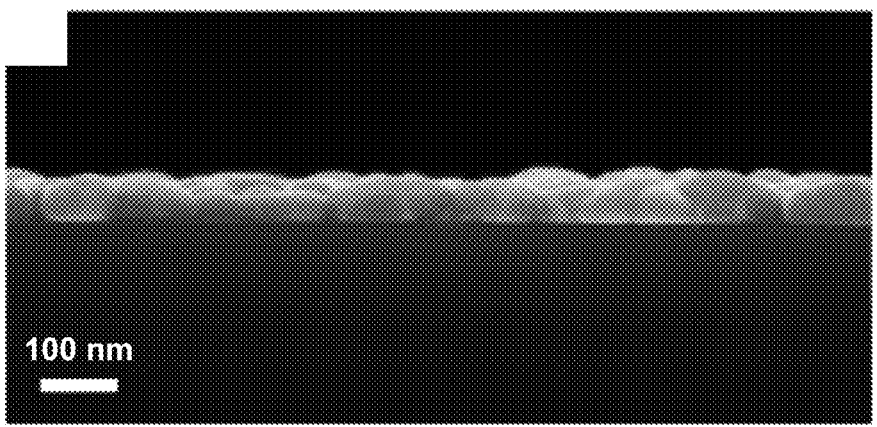

FIGS. 4A and 4B show examples of scanning electron microcopy images of sintered CdTe polycrystalline layers with Cl positioned at the grain boundaries. FIG. 4A shows a top-view and FIG. 4B shows a cross-sectional image of an about 50 nm thick layer. The scale bars in FIGS. 4A and 4B are 100 nm.

Figure 5:
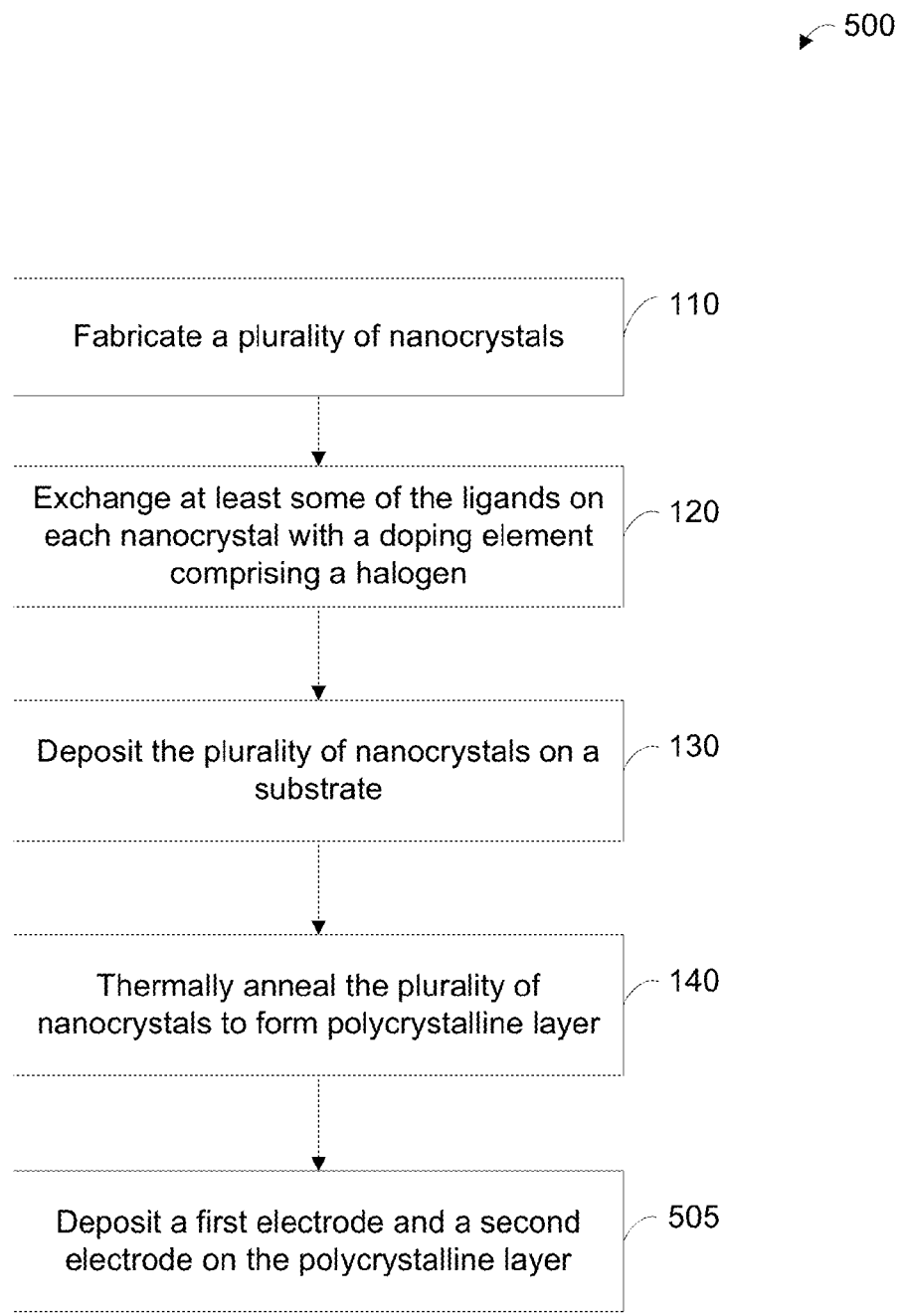
FIG. 5 shows an example of a flow diagram illustrating a manufacturing process for a photodetector device.

FIG. 5 shows an example of a flow diagram illustrating a manufacturing process for a photodetector device. The method 500 shown in FIG. 5 is the same as the method 100 shown in FIG. 1 with the addition an operation to deposit electrodes on the polycrystalline layer. At block 505 of FIG. 5, a first electrode and a second electrode are deposited on the polycrystalline layer. In some embodiments, the first electrode and the second electrode are deposited on the polycrystalline layer at the same time. In some embodiments, the first electrode and the second are deposited using a thermal evaporation process. Patterning techniques, including masking as well as etching processes, may be used to define the shapes of the electrodes on the polycrystalline layer. In some embodiments, the first electrode and the second electrode comprise a metal. In some embodiments, the first electrode and the second electrode each have a thickness of about 50 nm to 100 nm. For example, the first electrode and the second electrode may each comprise a layer of indium (e.g., about 60 nm thick) and a layer of gold (e.g., about 40 nm thick).

Figure 6A:
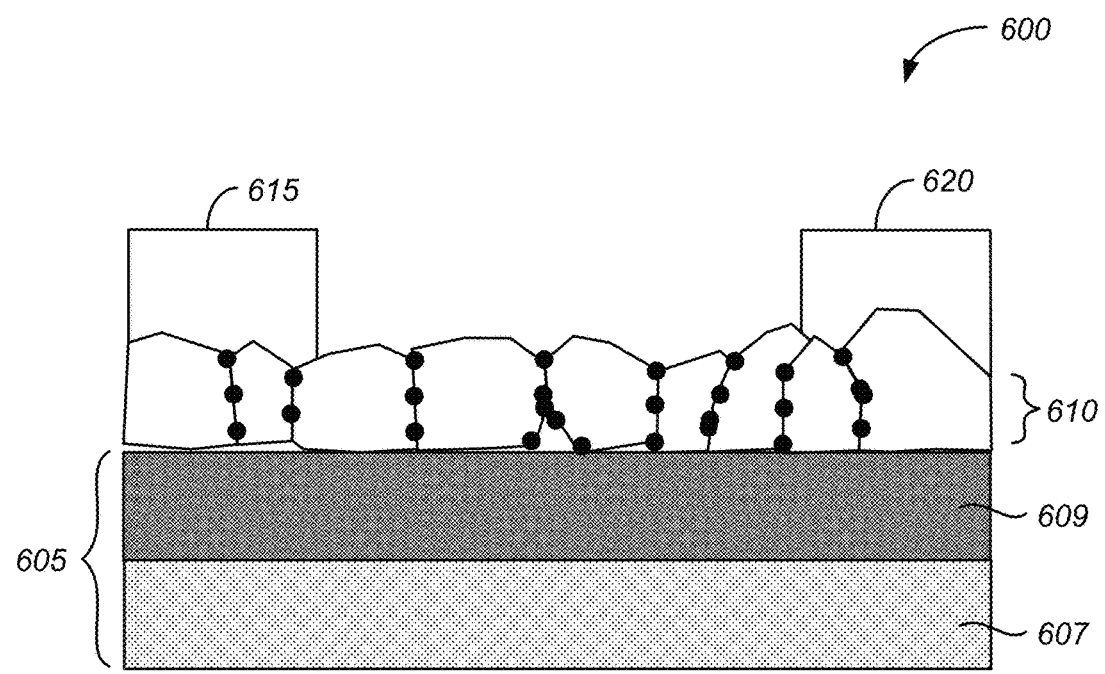
FIGS. 6A and 6B show examples of schematic illustrations of a phototransistor device.
Figure 6B:
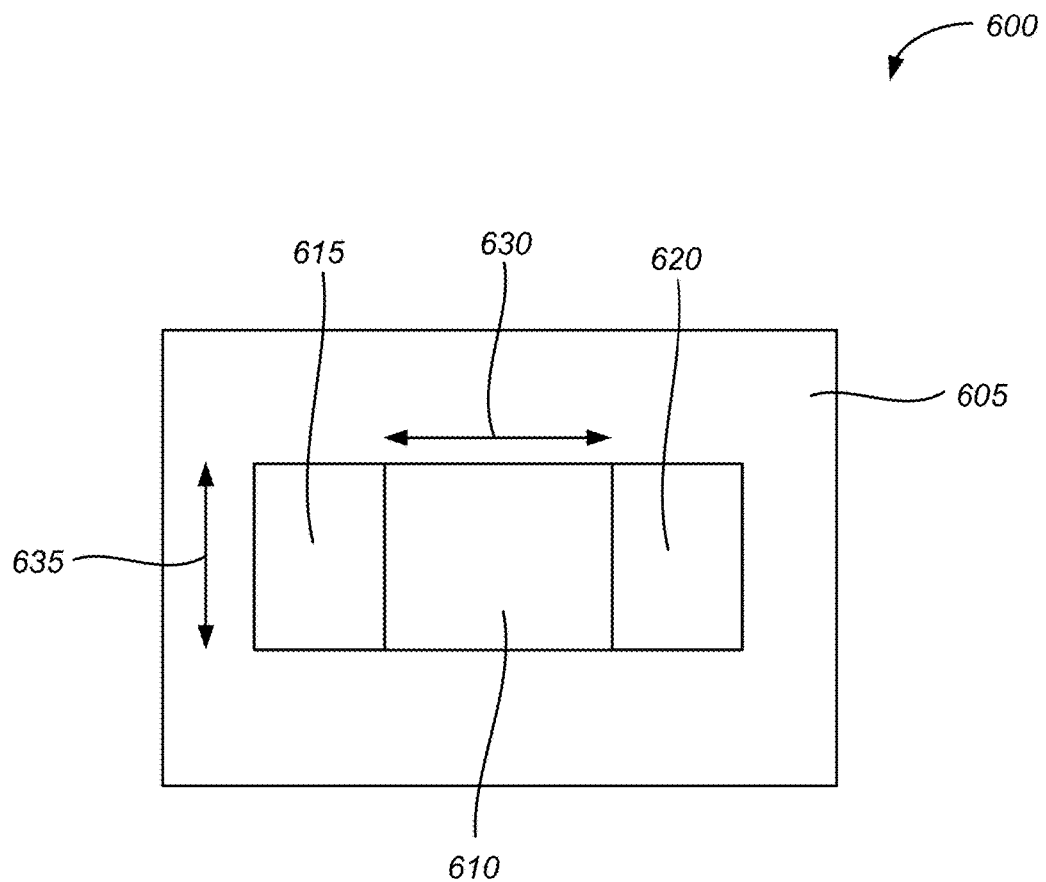

One type of photodetector device is a phototransistor device. FIGS. 6A and 6B show examples of schematic illustrations of a phototransistor device. FIG. 6A shows an example of a cross-sectional schematic illustration of a phototransistor device. FIG. 6B shows a top-down view of the phototransistor device. The phototransistor device 600 shown in FIGS. 6A and 6B includes a substrate 605, a polycrystalline layer 610 disposed on the substrate 605, and a first electrode 615 and a second electrode 620 disposed on the polycrystalline layer 610. In some embodiments, a length 630 between the first electrode 615 and the second electrode 620 is about 50 nm to 1 millimeter (mm) or about 5 microns to 100 microns. The shorter the length 630 between the first electrode 615 and the second electrode 620, the higher the photoconductive gain of the phototransistor device 600. In some embodiments, a width 635 of the polycrystalline layer 610 is about 50 nm to 10 meters (m) or about 80 microns to 3 mm. In some embodiments, a thickness of the polycrystalline layer 610 is about 50 nm to 10 mm, about 10 nm to 400 nm, or about 10 nm to 5 microns.

The substrate 605 comprises a conducting material 607 and an insulating material 609 disposed on the conducting material 607. The polycrystalline layer 610 is disposed on the insulating material 609. In some embodiments, the conducting material 607 comprises a metal or a heavily-doped semiconductor (e.g., heavily doped n-type silicon). The conducting material 607 serves as the gate of the phototransistor device 600. In some embodiments, the insulating material 609 comprises an oxide (e.g., silicon oxide). In some embodiments, the insulating material 609 is about 150 nm to 450 nm thick, or about 300 nm thick.

Measurements were performed on a phototransistor device as shown in FIGS. 6A and 6B. The phototransistor device used in the measurements was fabricated using the methods described above. The polycrystalline layer of the phototransistor device included a CdTe polycrystalline film with chlorine-doped grain boundaries. The phototransistor device had a length of 40 microns between the first electrode and the second electrode. The width of the polycrystalline layer was 3 mm and the thickness was 50 nm. A layer of $SiO_2$ having a thickness of 300 nm served as the insulating material. Heavily-doped n-type silicon served as the conducting material.

Figure 6C:
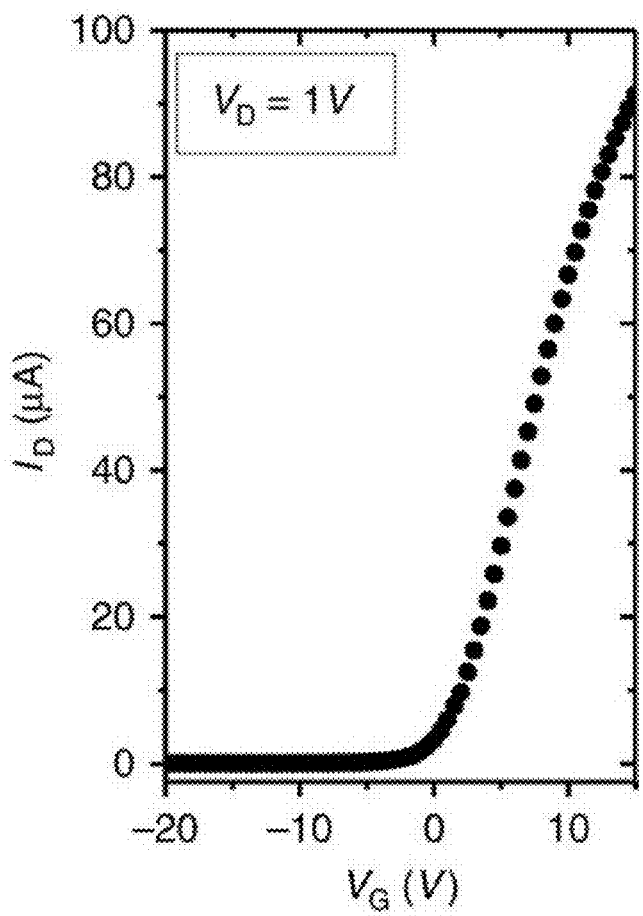
FIGS. 6C and 6D show the results of measurements performed with a CdTe phototransistor device.
Figure 6D:
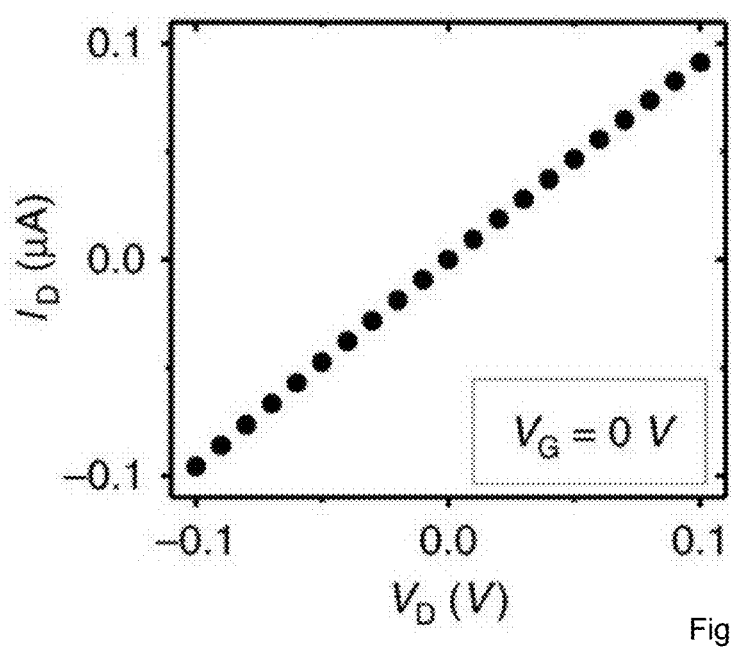

FIGS. 6C and 6D show the results of measurements performed with a CdTe phototransistor device. FIG. 6C shows a drain current ($I_D$)-gate bias ($V_G$) curve, with a fixed drain bias $V_D$=1 V. FIG. 6D shows an $I_D$-$V_D$ curve of the same device at $V_G$=0 V, which gives a conductivity of σ=2.5 mS cm$^{-1}$. The field-effect transistor (FET) measurements performed under dark conditions confirmed n-type electronic transport. Since the grain boundaries (GBs) formed a network with a large electrostatic electron confinement energy (around 0.4 eV with no or small gate bias) and a higher conductivity than the grain interiors (GIs), the GBs were expected to be the dominant electron transport pathways. From the gate bias-dependent current, a spatially averaged field-effect mobility of $\mu_{FET}$~5.2±2.3 cm$^2$ V$^{-1}$ s$^{-1}$ and a conductivity of σ~10$^{-4}$ S cm$^{-1}$ to 5×10$^{-3}$ S cm$^{-1}$ at $V_G$=0 V from devices made from several batches of CdTe nanocrystals were obtained, with the best $\mu_{FET}$~10 cm$^2$ V$^{-1}$ s$^{-1}$. The actual mobility and conductivity of the GBs can be much larger since most of the volume of the material is occupied by the GIs, which are inactive for transport in the dark. Quantitative carrier concentration analysis from the Kelvin probe force microscopy (KPFM) and field-effect transistor (FET) results further confirmed that electron transport occurs mainly through GB regions.

Control studies of layers sintered from CdTe nanocrystals with no Cl or with traditional top-down Cl treatments were performed. It was found that these layers had inferior structure and much lower mobility. This is strong evidence that Cl is an essential ingredient for a high-mobility layer and that the bottom-up GBDD approach (incorporating Cl onto the nanocrystal surface before sintering) is key for efficient Cl doping.

Figure 7A:
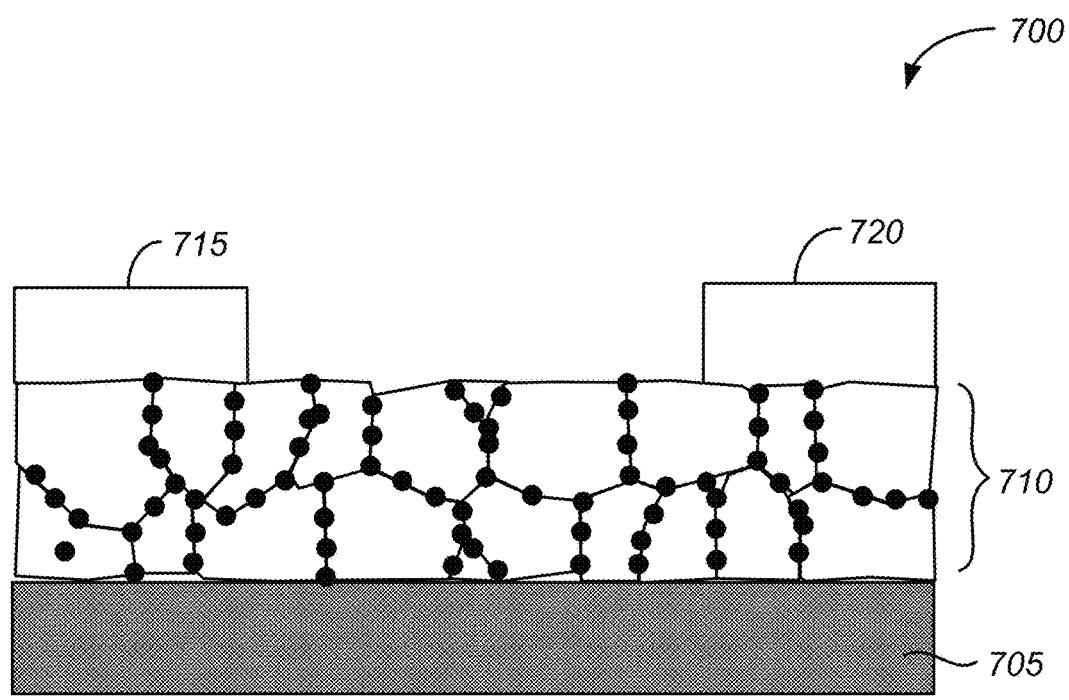
FIGS. 7A and 7B show schematic illustrations of a photoconductor device.
Figure 7B:
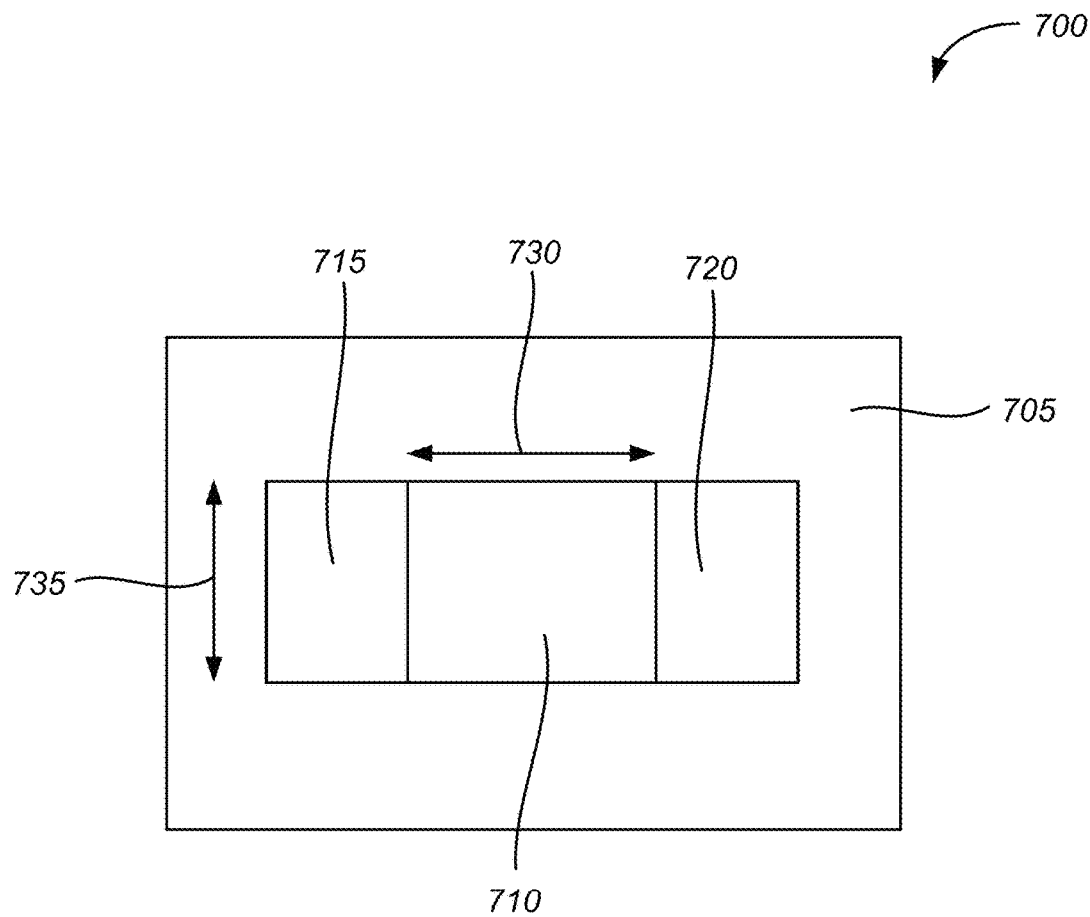

Another type of photodetector device is a photoconductor device, which may also be referred to as a photoresistor device. The electrical resistance of a photoconductor device decreases with increasing incident light intensity. FIGS. 7A and 7B show schematic illustrations of a photoconductor device. FIG. 7A shows an example of a cross-sectional schematic illustration of a photoconductor device. FIG. 7B shows a top-down view of the photoconductor device. The photoconductor device 700 shown in FIGS. 7A and 7B includes a substrate 705, a polycrystalline layer 710 disposed on the substrate 705, and a first electrode 715 and a second electrode 720 disposed on the polycrystalline layer 710. In some embodiments, a length 730 between the first electrode 715 and the second electrode 720 is about 50 nm to 1 mm or about 5 microns to 100 microns.

The shorter the length 730 between the first electrode 715 and the second electrode 720, the higher the photoconductive gain of the photoconductor device 700. In some embodiments, a width 735 of the polycrystalline layer 710 is about 50 nm to 10 m or about 80 microns to 3 mm. In some embodiments, a thickness of the polycrystalline layer 710 is about 50 nm to 10 mm, about 10 nm to 400 nm, or about 10 nm to 5 microns. In some embodiments, the substrate 705 comprises material that is transparent or substantially transparent to the wavelengths of light that the photoconductor device 700 is operable to detect. For example, to detect visible light (e.g., wavelengths of about 390 nm to 700 nm) the substrate may comprise quartz. In some embodiments, the substrate comprises a material that is transparent or substantially transparent to light having wavelengths of about 390 nanometers to 850 nanometers. In some embodiments, the substrate comprises a material that is transparent or substantially transparent to ultra-violet (UV) light, X-rays, or gamma rays.

Measurements were performed on photoconductor devices as shown in FIGS. 7A and 7B. The photoconductor devices used in the measurements were fabricated using the methods described above. The polycrystalline layer of the photoconductor devices included a CdTe polycrystalline film with chlorine-doped grain boundaries. The photoconductor devices had a length of 5 microns between the first electrode and the second electrode. The width of the polycrystalline layer was 2 mm for one device, and the width of the polycrystalline layer was 80 microns for another device. The thickness of the polycrystalline layer in the devices was 300 nm to 400 nm.

Figure 7C:
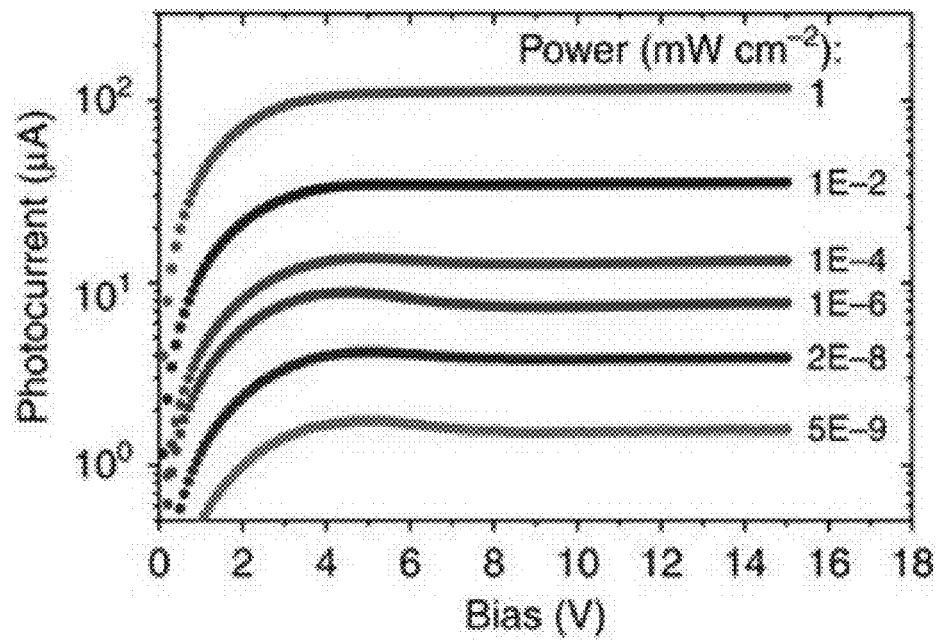
FIGS. 7C-7F show examples of the photoresponse of the two representative CdTe photoconductor devices.
Figure 7D:
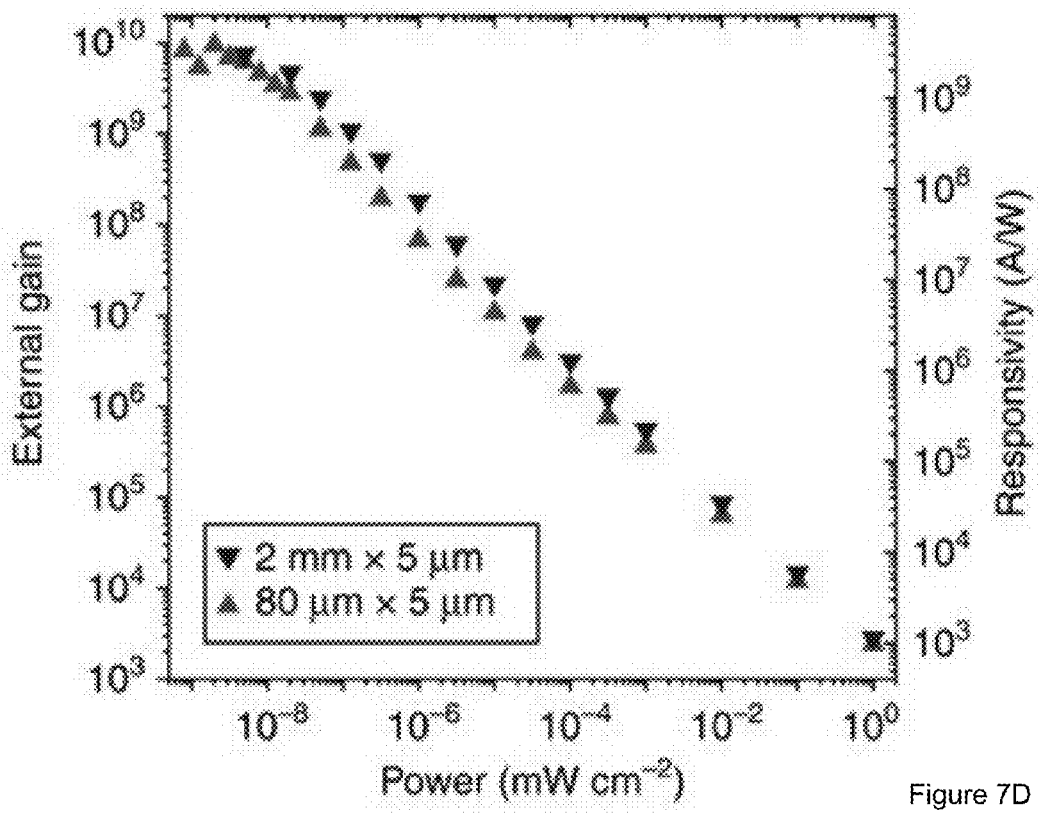
Figure 7E:
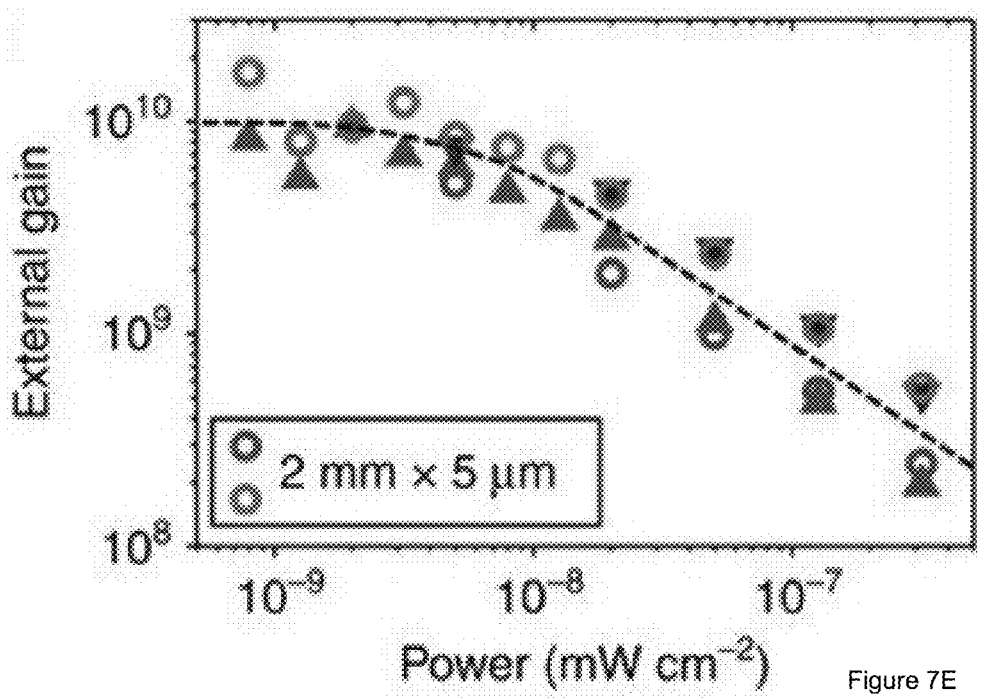

FIGS. 7C-7F show examples of the photoresponse of the two representative CdTe photoconductor devices. Photocurrent was generated by shining collimated, monochromatic light onto the entire channel region of the device. The photoconductor devices have a large dynamic range, sensitive to light intensities varying over nine orders of magnitude (See FIGS. 7C-7E). FIG. 7C shows photocurrent versus bias of a representative photoconductor device, measured with 500 nm monochromic light over a range of incident power. The photoconductor device had a channel thickness of 320 nm, a channel length of 5 microns, and a channel width of 2 mm. FIG. 7D shows external photoconductive gain and responsivity of photoconductor devices (incident wavelength of 500 nm, bias of 10 V). Channel width and length are labelled in the figure, where the inverted triangle points represent the same device as that shown in FIG. 7C. FIG. 7E shows the external gain of four devices at small photon power, where the triangle and inverted triangle points are the same as that in FIG. 7D.

The photoconductive gain and responsivity (i.e., photocurrent divided by incident photon power) increased with the decrease of photon intensity until the power reached 5×10$^{-9}$ mW cm$^{-2}$. This is a typical behavior for high-gain photoconductor devices due to the dispersion in the activation energies of the carrier trapping sites. When the power is below 5×10$^{-9}$ mW cm$^{-2}$, the external photoconductive gain (the number of collected photocarriers per incident photon) saturated at $G_{ext}$≈1×10$^{10}$ and the responsivity reached R≈4× 10$^9$ A W$^{-1}$ (at the wavelength of 500 nm). Both values are independent of the channel width and are the highest among all the visible and infrared photoconductor devices known in literature. It was found that the polycrystalline layer absorbed about 65% of the incoming light, and thus the internal gain (the number of collected carriers per absorbed photon) is also of the order of 10$^{10}$. To understand the gain mechanism, the internal gain can be approximated as $G_{int}$=$\tau_{lifetime}$/$\tau_{transit}$·$\eta$sep, where $\tau_{lifetime}$ is the minority carrier lifetime, $\tau_{transit}$ is the transit time of the majority carrier (time to move form source to drain), and $\eta_{sep}$ is the charge separation efficiency (the efficiency of carrier separation after photogeneration of electron-hole pairs, which is assumed to be close to unity due to the strong built-in electric fields). From this equation, it can be seen that the gain will increase with decreasing channel length (thus shorter transit time) up until the grain size limit.

Figure 7F:
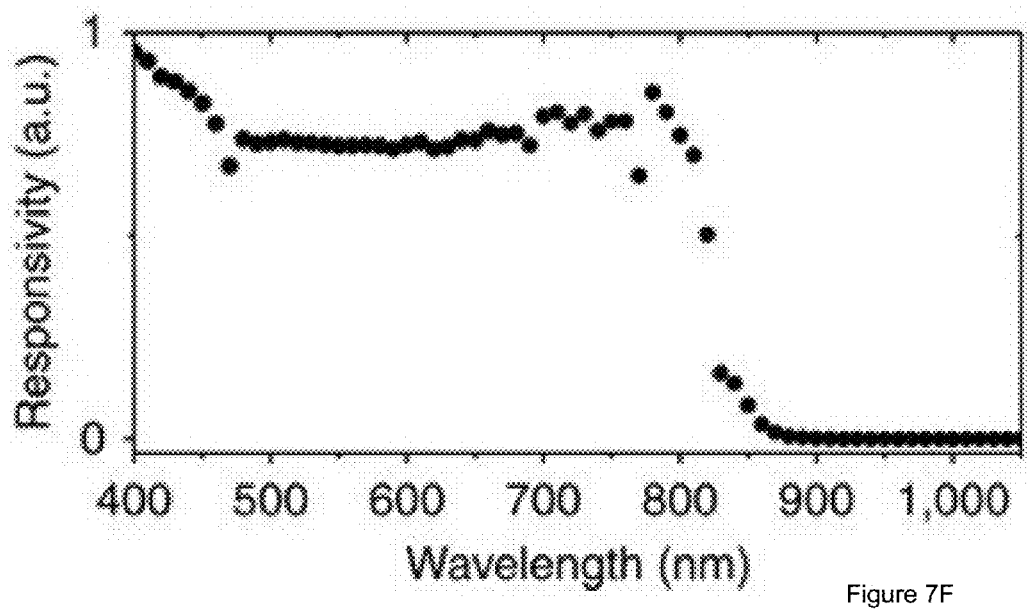

FIG. 7F shows the spectral response of a 2 mm×5 micron photoconductor device. The fluctuations are not due to the noise in the detector, but rather the spectral intensity variations of the light source. The photoconductor devices are responsive to photons with a wavelength less than 850 nm, the bandgap of bulk CdTe, covering the entire visible and a small part of near-infrared spectrum. The responsivity is nearly constant over the range of 400 nm to 800 nm, a property highly desirable for visible camera applications.

To determine the sensitivity of the photoconductor device, the dark noise current ($I_{noise}$) was measured and the noise equivalent power (NEP) was calculated, which represents the minimum detectable power at which the signal-to-noise ratio (SNR) is unity. It was found that the noise current at 0.1 Hz (the intrinsic bandwidth of the detector, inverse of the carrier lifetime, as shown later) is more than 1 order of magnitude larger than the shot noise limit, given by $I_{shotnoise} = \sqrt{2eI}$, where e is the elementary charge. The frequency dependence of the noise revealed that the 1/f noise (also called flicker noise, characterized by the relation $I_{noise}^2 \propto 1/f^\alpha$, where $\alpha$ is close to 1) dominated at low frequencies (f<10 Hz in this case), while at higher frequencies the noise current approached the shot noise limit. This low-frequency noise has been widely observed in almost all known electronic devices. Its exact mechanism is still not fully understood but it has been shown that more carrier-scattering defect sites induce higher levels of 1/f noise.

Figure 8:
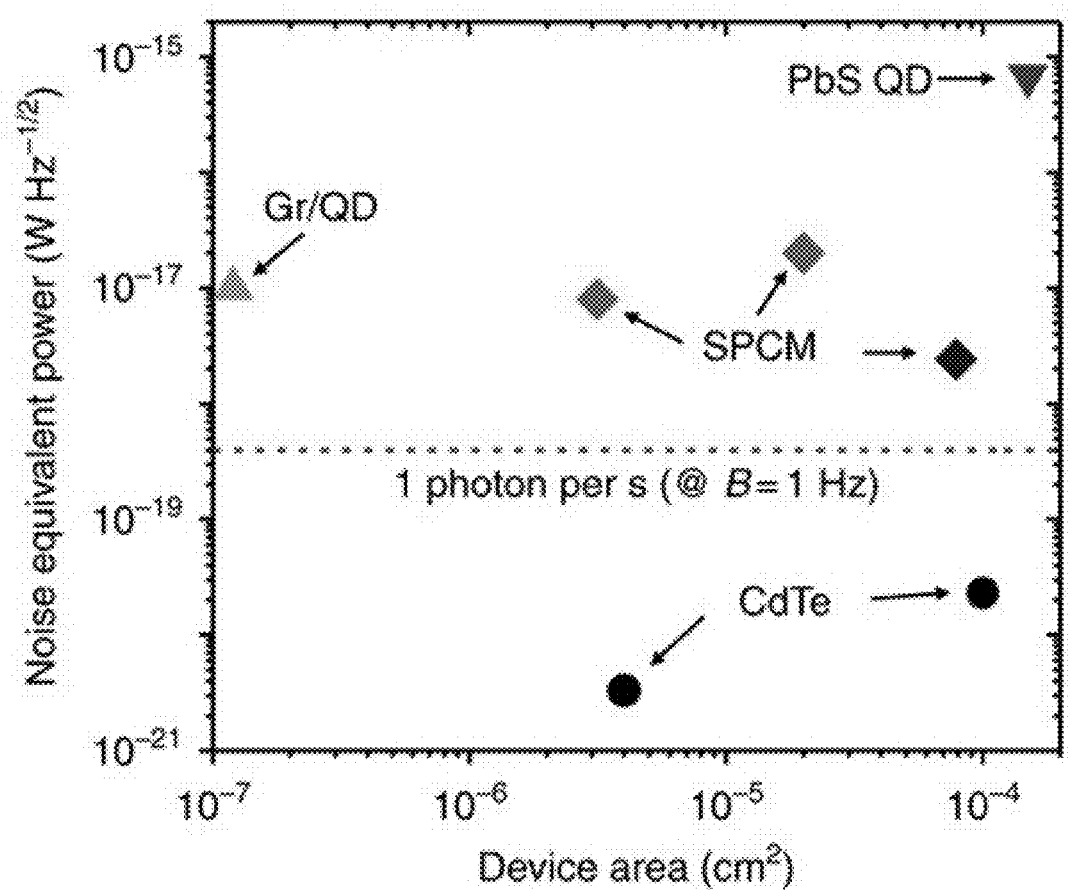
FIG. 8 shows an example of the noise equivalent power (NEP) of two CdTe photoconductor devices compared to other high-sensitivity photoconductor devices.

FIG. 8 shows an example of the noise equivalent power (NEP) of two CdTe photoconductive material-based devices compared to other high-sensitivity photoconductive material-based devices. Compared with previously reported noise measurements on cadmium chalcogenide nanocrystal layers and polycrystalline layers, the photoconductive material based-devices described herein show a much less 1/f noise, with a 1/f noise to shot noise ratio of about 2 orders of magnitude smaller (for f<10 Hz).

Figure 9A:
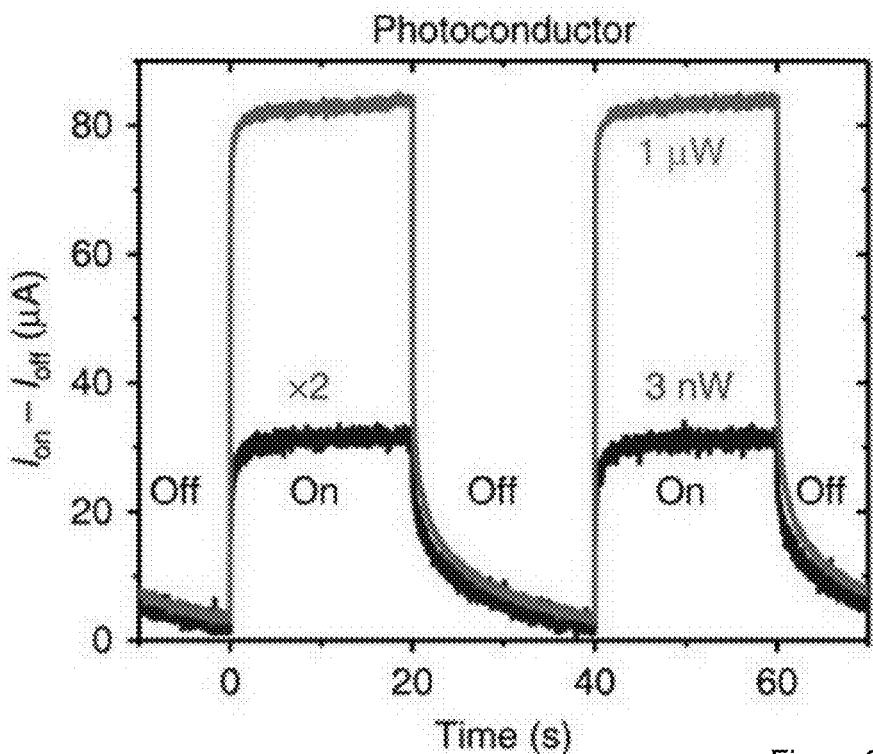
FIG. 9A shows the time-resolved photocurrents of a CdTe polycrystalline photoconductor device under two different light intensities.

Besides the gain and noise level, a photodetector's temporal response also determines the extent of its applications. As previously explained, high gain in a photoconductive material-based device requires long carrier lifetime, and as a result these detectors typically have slow response, in the scale of $10^{-2}$-$10^4$ seconds. FIG. 9A shows the time-resolved photocurrents of a CdTe polycrystalline photoconductor device under two different light intensities. At high intensity, the photocurrent decay consists of two components: a fast decay on the scale of 1 millisecond (ms), and a slow decay of ~10 seconds. At lower intensity, the slow component dominates. The rise time for both power levels is in the scale of 1 ms. In the low-light case, it can be seen that the photocurrent decayed to ~20% of the on-state value after the light was switched off for about 10 seconds (similar results were obtained for even lower photon flux). Therefore, it is expected that the responsivity at the low-light limit to be ~3×10$^9$ A W$^{-1}$ (80% of the direct current direct current (DC) value) under an AC modulation of 0.1 Hz (with a few ms on-time and 10 seconds off-time). $\tau_{lifetime} \approx 10$ seconds can also be estimated. Taking $G_{int} \approx 10^{10}$ and assuming that $\eta_{sep} = 1$, $\tau_{transit} \approx 1$ ns is calculated, which corresponds to a mobility of ~60 cm$^2$ V$^{-1}$ s$^{-1}$. This mobility is an order of magnitude higher than the measured bulk FET mobility, likely due to the volume averaging effect of the latter value, as mentioned above. Therefore, it is expected that the actual mobility in the GB s to be in the scale of several tens of cm$^2$ V$^{-1}$ s$^{-1}$. Note that in cases where $\eta_{sep}<1$, an even higher mobility would be expected.

Figure 9B:
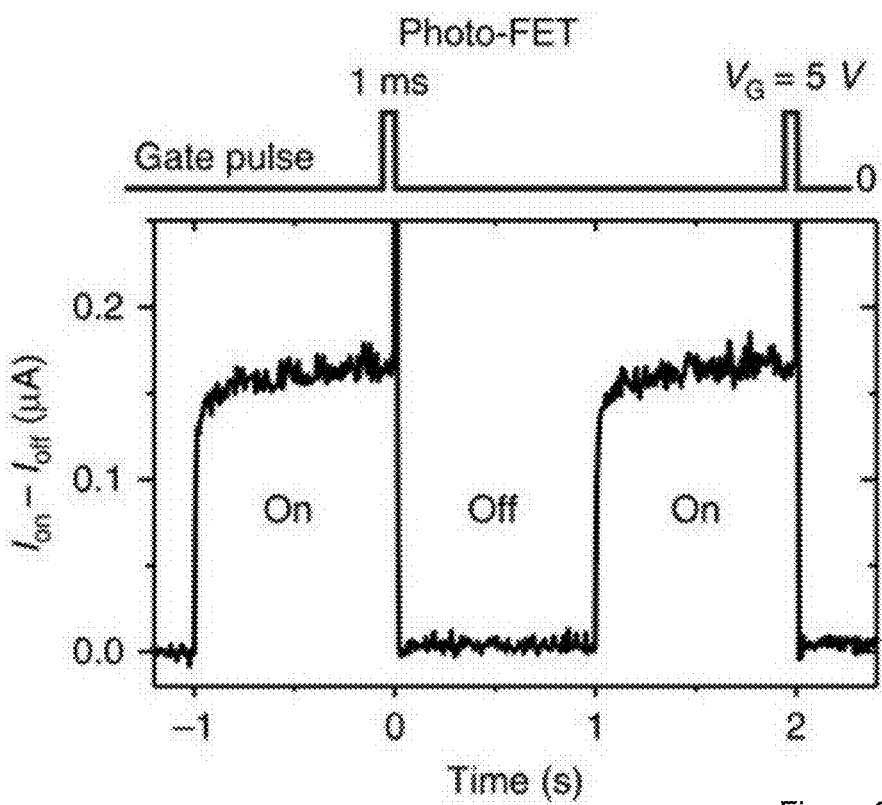
FIG. 9B shows the temporal response of photocurrent in a CdTe phototransistor device, with gate pulses applied.
Figure 9C:
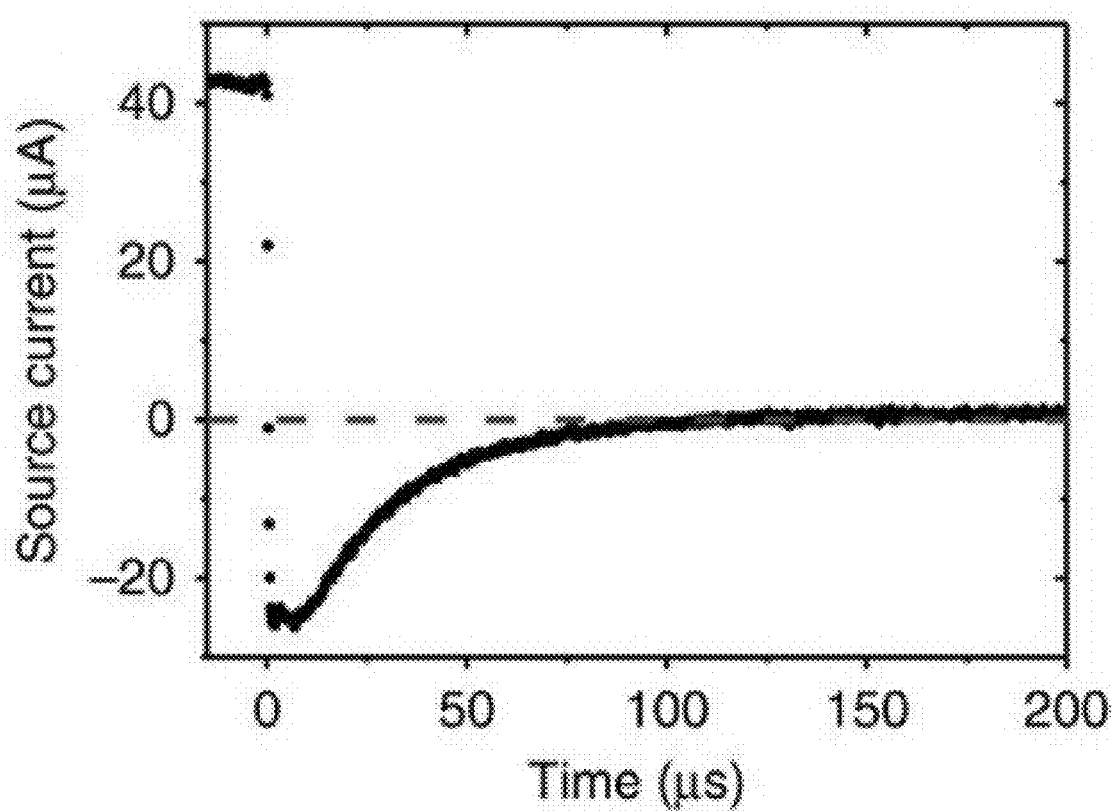
FIG. 9C shows the transient photocurrent response of the same phototransistor device as in FIG. 9B, with gate pulses applied.

One strategy to improve the device response speed in high-gain detectors is to apply a gate voltage pulse. Reset or quenching circuits are also widely used in photomultipliers and avalanche photodiodes. Since the hole traps in the devices described here are electrostatic in nature, it is expected that a positive gate pulse would flood the channel with electrons causing partial band flattening between the GIs and GB s, which reduces the electrostatic barrier yielding efficient electron-hole recombination. This mechanism was employed in a phototransistor device (the same device structure as shown in FIGS. 6A and 6B) and a reset protocol was implemented: a 5 V gate pulse applied for 1 ms. FIG. 9B shows the temporal response of photocurrent in a CdTe phototransistor device in the presence of a 1 ms gate pulse synchronized with the on-to-off switch of the 660 nm light at 0.4 mW (on/off modulation interval: 1 second). FIG. 9C shows the transient photocurrent response (within 200 ms) of the same phototransistor device as in FIG. 9B.

The source current rapidly decreased and changed sign within 1 microsecond (switch time of the light), and gradually returned to the original dark current value within about 100 microseconds. This sign switch reveals that the source-drain transport current (electrons injected from the source to the channel and collected by the drain) decayed within 1 microsecond after the gate was switched off, and the injected electrons left the channel via the source and drain electrodes within 100 microseconds. Therefore, when the gate pulse was applied, the photocurrent decay mechanism changed from slow hole decay to fast electron decay, increasing the speed by 5 orders of magnitude. The absence of the sluggish minority carrier decay current confirms the proposed mechanism of electron-hole recombination on application of the gate pulse and is consistent with the proposed electrostatic trapping scheme. Note that this strategy is not as efficient in photoconductive material-based devices that employ (or partially employ) sub-bandgap trap states which require higher pulse voltages to obtain a modest improvement in response speed.

Figure 10:
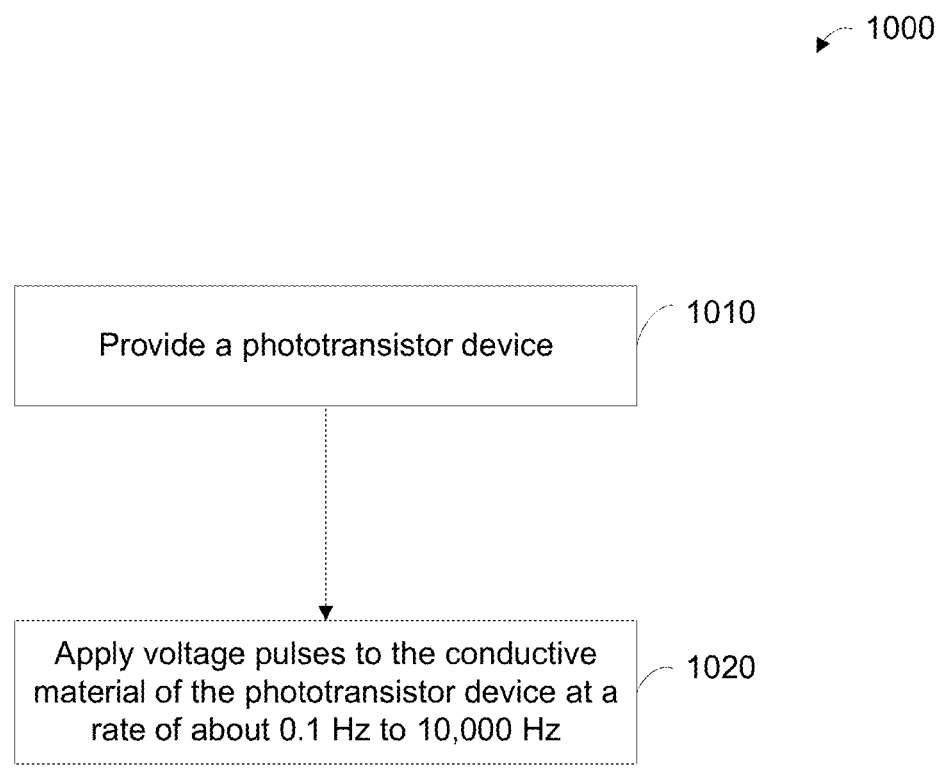
FIG. 10 shows an example of a flow diagram illustrating a method of use of a phototransistor device.

FIG. 10 shows an example of a flow diagram illustrating a method of use of a phototransistor device. At block 1010 of the method 1000 shown in FIG. 10, a phototransistor device is provided. The phototransistor device may be the phototransistor device 600 shown in FIGS. 6A and 6B. At block 1020, when the phototransistor device is in operation (e.g., when photons are striking the polycrystalline layer of the phototransistor device), voltage pulses are applied to the conductive material (i.e., the gate) of the phototransistor device. In some embodiments, the voltage pulses are applied to the conductive material at a rate of about 0.1 Hz to 10,000 Hz. In some embodiments, the voltage pulses are about 2.5 V to 7.5 V, or about 5 V. In some embodiments, a voltage pulse of the voltage pulses is applied for about 1 microsecond to 1 millisecond.

Specific detectivity D* is a standard measure of detector sensitivity that represents the intrinsic materials properties, independent of the device geometry. The specific detectivity D*=$\sqrt{A}$/NEP can be calculated from the measured NEP and the device area A. In the CdTe photoconductive material-based devices, D*$\approx$5×10$^{17}$ Jones (cm Hz$^{1/2}$ W$^{-1}$), the highest reported for all the visible and infrared photodetectors operating at room temperature. In comparison, the specific detectivity of single-crystal silicon photodiodes is about 1×10$^{13}$ Jones, and that of the graphene-quantum dot hybrid photodetector (one of the most sensitive photoconductive material-based devices) is 7×10$^{13}$ Jones.

The GB doping and conduction properties are not unique to the CdTe system. In fact, GB-assisted photocarrier collection occurs in a wide variety of emerging photovoltaic materials, such as Cu(In, Ga)Se$_2$ (CIGS), Cu$_2$ZnSnS$_4$ (CZTS), and organic-inorganic halide perovskites. Similar to CdTe polycrystalline layers, these materials are currently fabricated mostly via top-down approaches. It is expected that the bottom-up GBDD approach demonstrated herein would be applicable in these systems as well. By tuning the surface chemistry of the NC building blocks and the sintering conditions, the grain size, GB doping, and connectivity can be organized, therefore modulating the charge transport, photoconduction and/or photovoltaic properties.

The demonstrated concept of mesoscale percolation pathway engineering can have potential impacts in other electron-based materials and devices beyond optoelectronics, involving the interaction of electrons with other degrees of freedom such as spin and phonons. As an example, a heterogeneous system where electronic transport and thermal transport take place via different pathways can be envisioned. For example, high electrical conductivity and low thermal conductivity could be achieved simultaneously for thermoelectric materials. This would enhance the thermoelectric figure of merit for thermoelectric materials.

Potential applications of the photoconductive material-based devices described herein, including the CdTe photoconductive material-based devices, include visible camera applications, night-vision cameras, X-ray and Gamma ray detectors, and Cherenkov particle detection.

Visible camera applications. The CdTe photoconductive material-based devices are compatible with CCD and CMOS technologies and have a high signal-to-noise ratio and a good response speed (~1 ms with gate pulse reset) capable of video-rate imaging. The CdTe photoconductive material-based devices thus have great potential for pixelated imaging in visible cameras. In the current digital camera technology, the active pixel layer may be made of single crystal silicon with a thickness of a few microns. In the CdTe photoconductive material-based devices, a ~300 nm thick layer of polycrystalline CdTe is capable of absorbing around two thirds of the visible light. Therefore, a CdTe polycrystalline layer can potentially replace Si as the pixel layer, with the advantage that the smaller thickness will reduce pixel crosstalk. The low-cost solution processing and the ease of integration with the CCD and CMOS integrated circuits are appealing for this application.

Night-vision cameras. There are currently two types of commercial night-vision cameras: thermal imaging cameras and image intensifiers. A thermal imaging camera detects infrared light emitted by objects, and a contrast is formed if an object has a different temperature from its surroundings. This is effective in identifying warm objects in cool environments when little or no visible light is present. However, these cameras cannot directly resolve the color of the objects, losing an important feature for object identification. Moreover, objects with similar temperature cannot be distinguished. An image intensifier camera multiplies the light emitted by faint objects, but requires high power and has limited light amplification and signal-to-noise ratio. CdTe photoconductive material-based devices, with unprecedented sensitivity, should be capable of resolving objects under low light conditions, such as the light from the moon and stars. The visible light can thus be detected to obtain images with true color. In the range of 700 nm to 850 nm, a small part of the near-infrared light that provides an additional imaging channel can also be detected.

A comparison of the night time illuminance level with the NEP of a CdTe photoconductive material-based device reveals the advantages of the CdTe photoconductive material-based devices in night vision. The total starlight at overcast night can be as low as $3\times10^{-5}$ lux to $1\times10^{-4}$ lux, corresponding to a photon intensity of $4\times10^{-12}$ to W/cm$^2$ to $1.5\times10^{-11}$ W/cm$^2$ at a wavelength of 555 nm. Using a camera where each pixel has an area of 2×2 µm$^2$, the equivalent photon flux that needs to be detected per pixel is $2\times10^{-19}$ W to $6\times10^{-19}$ W (~1 photon per second). As can be seen from FIG. 8, a CdTe photoconductive material-based device has a significant advantage over other detectors in detecting this low level of light.

X-ray and Gamma ray detectors. As CdTe has a high stopping power for X-rays and Gamma rays, single crystal CdTe diodes have already been used as commercial detectors at these very short wavelengths. To detect these high energy photons, a thick device (~1 mm) is needed. A polycrystalline CdTe layer can be scaled to this thickness by the spray coating of nanocrystals before sintering, for example. The high sensitivity of the detector would make it possible to image low levels of X-ray, which is important for medical applications where a low X-ray dosage is desired.

Cherenkov particle detection. Cherenkov radiation is an important feature revealing the speed of charged high-energy particles. From the radiation position and angle the speed and nature of the particle can be determined. Cherenkov detectors currently used in particle detection experiments are in the form of photomultiplier tubes (PMTs), which are expensive and demand a large amount of power to operate, especially since thousands of the meter-sized PMTs are needed to detect trace amounts of particles. Because a polycrystalline CdTe layer has the highest detectivity to date and can be scaled to very large sizes due to the solution processability, the layers may have impacts in the area of particle detection.

CONCLUSION

Further information regarding the embodiments described herein can be found in Y. Zhang et al., "Ultrasensitive photodetectors exploiting electrostatic trapping and percolation transport," Nature Communications 7, 11924 (2016), which in herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
    (a) fabricating a plurality nanocrystals, the plurality of nanocrystals comprising a semiconductor material, and each nanocrystal of the plurality of nanocrystals having ligands disposed on a surface of the nanocrystal;
    (b) exchanging at least some of the ligands on each nanocrystal of the plurality of nanocrystals with a doping element comprising a halogen;
    (c) after operations (a) and (b), depositing the plurality of nanocrystals on a substrate;
    (d) thermally annealing the plurality of nanocrystals to form a polycrystalline layer comprising nanograins; and
    (e) depositing a first electrode and a second electrode on the polycrystalline layer, a length of the polycrystalline layer being between and separating the first electrode and the second electrode.

2. The method of claim 1, wherein the doping element segregates to grain boundaries in the polycrystalline layer during operation (d).

3. The method of claim 1, wherein the plurality of nanocrystals comprise a semiconductor material selected from a group consisting of a III-V semiconductor material and a II-VI semiconductor material.

4. The method of claim 1, wherein the doping element comprises chlorine.

5. The method of claim 1, wherein operation (d) is performed at about 150° C. to 800° C.

6. The method of claim 1, wherein operation (d) is performed for about 1 second to 30 minutes.

7. The method of claim 1, wherein operation (d) is performed in an inert atmosphere.

8. The method of claim 1, wherein each of the nanograins has a largest dimension of about 10 nanometers to 200 nanometers.

9. The method of claim 1, wherein the polycrystalline layer has a thickness of about 10 nanometers to 5 microns.

10. The method of claim 1, wherein the length of the polycrystalline layer between the first electrode and the second electrode is about 50 nanometers to 1 millimeter.

11. A method comprising:
(a) fabricating a plurality nanocrystals, the plurality of nanocrystals comprising cadmium telluride (CdTe), and each nanocrystal of the plurality of nanocrystals having cadmium oleate ligands disposed on a surface of the nanocrystal;
(b) exchanging at least some of the cadmium oleate ligands on each nanocrystal of the plurality of nanocrystals with a doping element comprising chlorine;
(c) after operation (b), depositing the plurality of nanocrystals on a substrate;
(d) thermally annealing the plurality of nanocrystals to form a polycrystalline layer comprising nanograins, the chlorine segregating to grain boundaries in the polycrystalline layer during the thermal annealing; and
(e) depositing a first electrode and a second electrode on the polycrystalline layer, a length of the polycrystalline layer being between and separating the first electrode and the second electrode.

12. The method of claim 11, wherein operation (b) comprises:
dispersing the plurality of nanocrystals in toluene;
adding tributylphosphine (TBP) to the plurality of nanocrystals dispersed in toluene; and
after adding the tributylphosphine, adding trimethylsilychloride (TMSCl) to the plurality of nanocrystals dispersed in toluene.

13. The method of claim 11, further comprising:
after operation (d), removing the polycrystalline layer from the substrate; and
depositing the polycrystalline layer on a substrate of a photodetector device.

14. The method of claim 11, further comprising:
after operation (a), purifying the plurality of nanocrystals by suspending the plurality of nanocrystals in a liquid and separating the plurality of nanocrystals from the liquid.

15. The method of claim 11, wherein operation (d) is performed at about 350° C.

16. The method of claim 11, wherein operation (d) is performed for about 30 seconds to 5 minutes.

17. The method of claim 11, wherein operation (d) is performed in an argon atmosphere.

18. The method of claim 11, wherein each of the nanograins has a largest dimension of about 50 nanometers to 75 nanometers.

19. The method of claim 11, wherein the polycrystalline layer has a thickness of about 10 nanometers to 5 microns.

20. The method of claim 11, wherein the length of the polycrystalline layer between the first electrode and the second electrode is about 50 nanometers to 1 millimeter.

* * * * *